(12) United States Patent
Brox et al.

(10) Patent No.: US 7,398,444 B2
(45) Date of Patent: Jul. 8, 2008

(54) LOOP-BACK METHOD FOR MEASURING THE INTERFACE TIMING OF SEMICONDUCTOR DEVICES WITH THE AID OF SIGNATURES AND/OR PARITY METHODS

(75) Inventors: Martin Brox, München (DE); Robert Kaiser, Kaufering (DE); Volker Kilian, München (DE); Wolfgang Spirkl, Germering (DE)

(73) Assignee: Infineon Technologies AG, Munich (DE)

( * ) Notice: Subject to any disclaimer, the term of this patent is extended or adjusted under 35 U.S.C. 154(b) by 270 days.

(21) Appl. No.: 11/220,332

(22) Filed: Sep. 6, 2005

(65) Prior Publication Data

US 2006/0059397 A1 Mar. 16, 2006

(30) Foreign Application Priority Data

Sep. 6, 2004 (DE) ...................... 10 2004 043 050

(51) Int. Cl.
*G01R 31/28* (2006.01)
(52) U.S. Cl. ...................................... 714/736
(58) Field of Classification Search .................. 714/736
See application file for complete search history.

(56) References Cited

U.S. PATENT DOCUMENTS

| | | | | |
|---|---|---|---|---|
| 5,357,523 A | * | 10/1994 | Bogholtz et al. | 714/718 |
| 5,475,815 A | * | 12/1995 | Byers et al. | 714/32 |
| 6,088,274 A | * | 7/2000 | Dorney et al. | 365/201 |
| 6,282,134 B1 | * | 8/2001 | Kumar | 365/201 |
| 6,675,322 B1 | | 1/2004 | Schaffroth et al. | |
| 6,760,873 B1 | * | 7/2004 | Hao et al. | 714/724 |
| 7,137,055 B2 | * | 11/2006 | Hirano et al. | 714/738 |
| 2006/0059394 A1 | | 3/2006 | Spirkl | |

FOREIGN PATENT DOCUMENTS

DE   198 32 307       2/2000
JP     05264667       10/1993

OTHER PUBLICATIONS

M. Gerner, B. Müller and G. Sandweg, Selbsttest digitaler Schaltungen (Self-test of Digital Circuits), München, Germany, R. Oldenbourg, 1990, pp. 74-82, 136, 137 and 140-151, ISBN 3-486-21765-8.

* cited by examiner

Primary Examiner—James C Kerveros
(74) Attorney, Agent, or Firm—Patterson & Sheridan, L.L.P.

(57) ABSTRACT

The invention relates to a method for testing a memory device with the memory device being able to be operated in a normal operating mode and a test mode and encompassing an output driver, input driver, and data pads. The method includes the steps of communicating test input data to be used for a test to the memory device, performing a test using the test input data in order to obtain test output data, the test data read out being passed via an output driver, at least one data pad, and an input driver, wherein the input drivers and output drivers are switched during the test in such a way as to enable data to be simultaneously read from and written to the memory device, and creating a data test result from the test output data. Furthermore, the invention relates to a memory device and a system for testing a memory device.

24 Claims, 2 Drawing Sheets

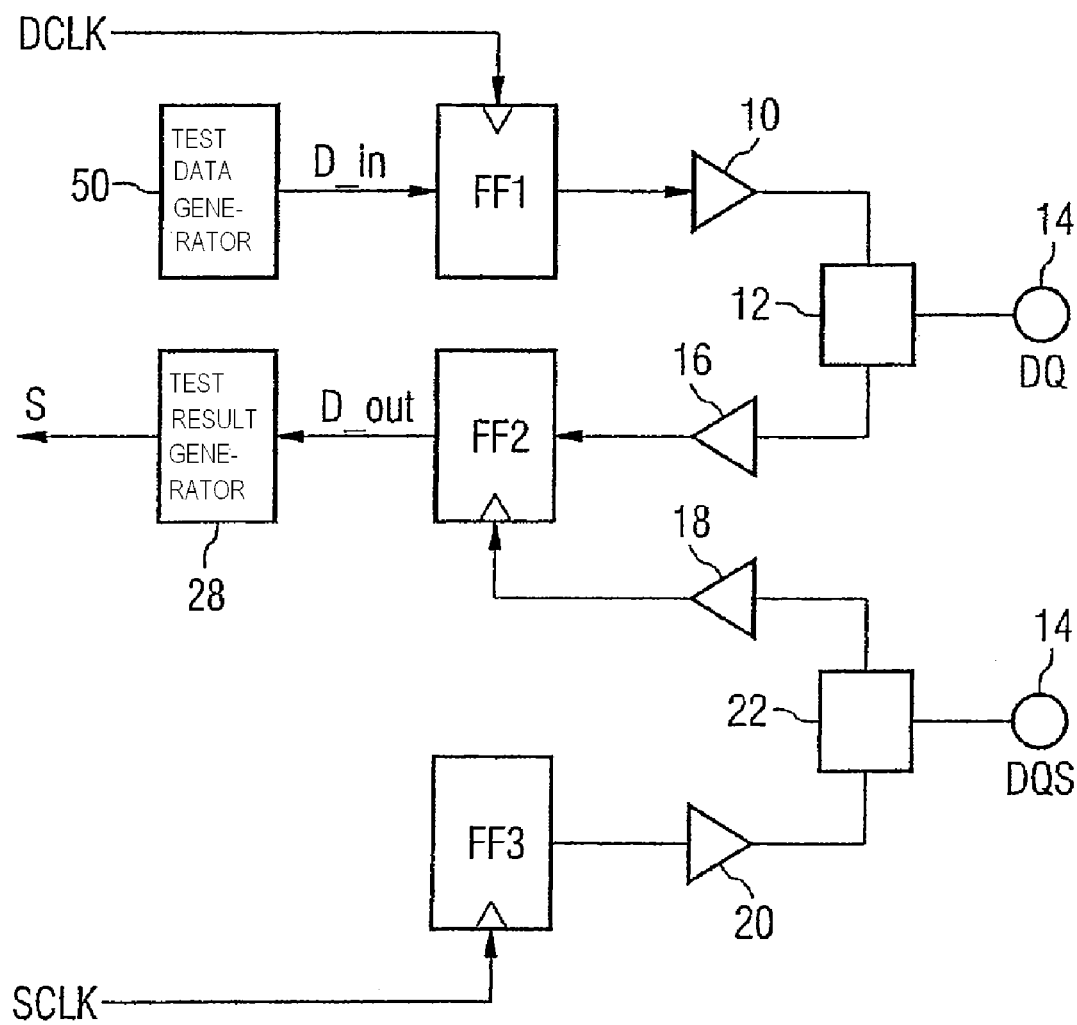

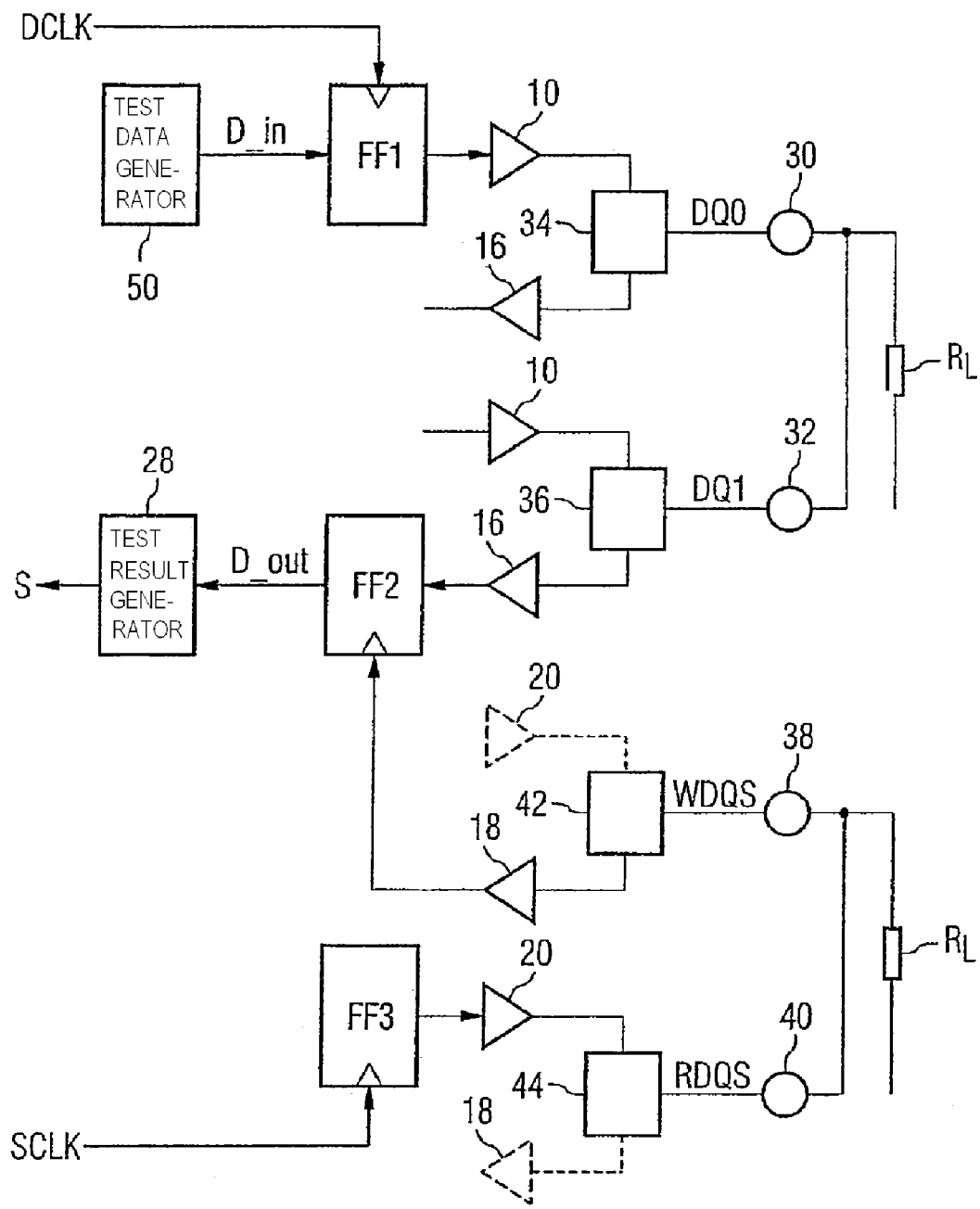

LOOP-BACK METHOD FOR MEASURING THE INTERFACE TIMING OF SEMICONDUCTOR DEVICES WITH THE AID OF SIGNATURES AND/OR PARITY METHODS

CROSS-REFERENCE TO RELATED APPLICATIONS

This application claims foreign priority benefits under 35 U.S.C. §119 to co-pending German patent application number DE 10 2004 043050.0, filed 6 Sep. 2004. This related patent application is herein incorporated by reference in its entirety.

This application is related to commonly-assigned U.S. patent application Ser. No. 11/220,169, entitled LOOP-BACK METHOD FOR MEASURING THE INTERFACE TIMING OF SEMICONDUCTOR MEMORY DEVICES USING THE NORMAL MODE MEMORY, filed Sep. 6, 2005, by Wolfgang Spirkl, published as US2006/0059394.

BACKGROUND OF THE INVENTION

1. Field of the Invention

The present invention relates to a method and a system for testing a semiconductor device, and to a semiconductor device.

2. Description of the Related Art

Methods for testing semiconductor devices, in particular the interface timing, are known in which a test pattern to be used for testing the semiconductor device is communicated to the semiconductor device and passed along a signal path in the semiconductor device to be tested. The data passed via the signal path are compared with the original test data in order to determine possible errors which have occurred during the test. For this purpose, the original test data have to be maintained with a very precise timing. For this reason, it is necessary to provide additional circuits on the semiconductor device in order to achieve the precise timing and the comparison of the data, which leads to an enlargement of the size of the semiconductor device and/or an impairment of the timing accuracy of the semiconductor device.

SUMMARY OF THE INVENTION

Consequently, it is an object of the present invention to provide a method and a system for testing a semiconductor device and a semiconductor device which enable simple testing, in particular of the interface timing, of the semiconductor device.

The invention provides a method for testing a semiconductor device. The semiconductor device is able to be operated in a normal operating mode and a test mode and comprises an output driver, an input driver, and data pads. The method comprises the following steps of communicating test input data to be used for a test to the semiconductor device, in particular from an external test unit, carrying out a test using the test input data in order to obtain test output data, in particular for testing the propagation delay times in the semiconductor device, the test data read out being passed via output drivers, at least one data pad and input drivers wherein the input drivers and output drivers are switched during the test in such a way as to enable data to be simultaneously read from and written to the semiconductor device, and creating a data test result from or using the test output data.

A data test result in the sense of the invention is understood to mean in particular a test result which is generated essentially only using the test output data themselves. Consequently, it is not necessary to carry out a comparison of test input data and test output data in which the test input data have to be maintained with a very precise timing in order to be able to be compared with the test output data.

In one preferred embodiment, the semiconductor device is a semiconductor memory device.

Preferably, the step of creating the data test result comprises a step of creating or calculating a signature from the test output data.

The data test result can thus be obtained in the form of a signature that is calculated or created from the test output data. In this case, a signature is understood to mean an unambiguous function of the test output data wherein the probability of the signature being correct even though the data are incorrect, or the significance level of the so-called "false pass probability", is sufficiently low.

It is further preferred for the test output data for creating the signature be combined at least partially in groups.

It may be provided that test output data are present at different locations on the semiconductor device. In order to achieve a circuit construction that is as simple as possible, and thus not to enlarge the size of the semiconductor device unnecessarily, test output data which are each present in a locally delimited or adjacent region can be grouped and a signature can subsequently be created from these grouped data.

A step of comparing the created signature with a desired signature may furthermore be provided.

In this case, the desired signature is a signature that has been calculated in the front-end stages. The desired signature may be determined in particular by using a known semiconductor device (so-called "known good device"), preferably under conditions which permit a relaxed timing. As an alternative, the desired signature may be determined computationally. Consequently, this desired signature may be determined either experimentally or by simulation.

The comparison step may be performed in or on the semiconductor device and/or in an external test device.

A signature register is preferably used for creating the signature. The signature register is preferably an MISR, that is to say a multiple input signature register.

Preferably, the test input data contain or comprise redundant information and the step of creating the data test result is performed using the redundant information of the test output data. Consequently, it is possible to use a redundancy method in order to create the data test result.

It may furthermore be provided, in particular, that a redundancy is provided in the test input data instead of using a signature. This redundant information can then be used for generating a data test result without requiring a signature.

It is further preferred for parity bits which contain information about a predetermined number of further test input data bits to be provided in the test input data.

The provision of the parity bits thus makes it possible to obtain information about whether or not an error occurred during the test.

Preferably, the semiconductor device comprises a memory area and the method comprises a step of storing the test input data in memory cells of the memory area.

It is further preferred for the semiconductor device to be a semiconductor memory device and the method to comprise a step of storing the test input data in memory cells of a memory area of the semiconductor memory device which is used for storing data in the normal operating mode.

In particular, using the memory area which is used for storing data in the normal operating mode for storing test input data in the test mode means that the required area of the semiconductor memory device can be reduced since there is no need for an additional memory area for storing the test input data. Furthermore, it is not necessary to provide a multiplexer that enables a changeover between the memory area used in the test mode and the memory area used in the normal operating mode. Furthermore, using the memory area which is used for storing data in the normal operating mode for storing the test input data means that it is possible to store a larger number of test patterns or test patterns having a larger number of bits. In particular, the size of the test pattern is only limited by the size of the memory area.

Furthermore, the test can be carried out under more realistic conditions compared with the prior art since the noise that occurs during the use of the memory cell array is now also present during test operation.

Preferably, the stored test input data are received and/or read out from the memory cells at least partially in parallel and the read-out step comprises a step of converting the parallel test input data into serial data, which are used for performing the test, in particular with the aid of a parallel-to-serial conversion device.

Preferably, provision is made of a predeterminable number of parallel lines between the memory cell array and the parallel-to-serial conversion device, via which the test input data are read out in parallel.

Preferably, the output driver and the input driver via which the test data are conducted are each assigned to the same data pad.

A so-called "inner loop" is thus formed, the test signals essentially being communicated only within the semiconductor device to be tested.

It may be provided that essentially each data pad is signal-connected to a data contact. In the test mode, each of two data contacts are signal-connected to one another, in particular via an external load resistor and the test data are conducted through an output driver of a first data pad, a first data contact signal-connected to the first data pad, the second data contact signal-connected to the first data contact, a second data pad signal-connected to a second data contact, and an input driver of the second data pad.

A so-called "external loop" is thus formed. In this case, the test signals are conducted out of the semiconductor device via a first data contact or ball and conducted in via a second data contact or ball, which is signal-connected to the first data contact.

The read-out order of the test data stored in the memory cells is preferably altered in order to generate different test patterns.

In particular, for this purpose it is possible to use the counting device used in the auto-refresh or an operating mode for a self-refresh. Different test patterns can be generated depending on the order in which the test data stored in the memory cells are read out.

The invention further provides a semiconductor device which can be operated in a normal operating mode and a test mode, the semiconductor device comprising a device for providing test input data, output drivers, input drivers, and data pads. In the test mode an output driver, at least one data pad, and an input driver are signal-connected to one another and the input drivers and the output drivers are switched during the test in such a way as to enable data to be simultaneously read from and written to the semiconductor device in order to obtain test output data, with the semiconductor device comprising a data test result generating device for creating a data test result from the test output data.

It is further preferred for the data test result generating device comprises a signature device for creating or calculating a signature from the test output data.

The semiconductor device preferably comprises a signature comparison device for comparing the created signature with a desired signature.

Consequently, the comparison step may be performed in or on the semiconductor device.

As an alternative, the comparison step may be performed in an external test device.

The semiconductor device may comprise a signature register, in particular a multiple input signature register (MISR), for creating the signature.

Preferably, the test input data contains or comprises redundant information and the semiconductor device comprises a device for creating the data test result using the redundant information of the test output data.

Parity bits containing an item of information about a predetermined number of further test input data bits are preferably provided in the test input data.

The semiconductor device preferably comprises output drivers, in particular, for amplifying a data signal to be read out from the semiconductor device, input drivers, in particular, for amplifying a data signal to be written to the semiconductor device, and data pads and is designed in such a way that in the test mode an output driver, at least one data pad, and an input driver are signal-connected to one another and the input drivers and output drivers are switched during the test in such a way as to enable data to be simultaneously read from and written to the semiconductor device.

Preferably, the output driver and the input driver via which the test data are conducted are each assigned to the same data pad.

It may be provided that essentially each data pad is signal-connected to a data contact and, in the test mode, each two data contacts are signal-connected to one another via an external load resist and the semiconductor device is designed in such a way that the test data are conducted via an output driver of a first data pad through a first data contact signal-connected to the first data pad, a second data contact signal-connected to the first data contact, a second data pad signal-connected to a second data contact, and an input driver of the second data pad.

The device for providing test input data may preferably comprise at least one memory cell array. The semiconductor device is designed in such a way that, in the test mode, test input data can be stored in the memory cell array and the stored test input data can be read out from the memory cell array for performing a test in order to obtain test output data.

In a preferred embodiment, the semiconductor device is a semiconductor memory device and the memory cell array in which the test input data can be stored is used for storing data in the normal operating mode.

Preferably, the semiconductor device comprises a parallel-to-serial conversion device for converting test input data that are received and/or read out from the memory cell array in parallel into serial data which are used for performing the test.

The invention further provides a system for testing a semiconductor device, comprising a semiconductor device in accordance with the present invention or a preferred embodiment thereof and an external test unit for driving the semiconductor device with the external test unit being designed to bring the semiconductor device into the test mode for a test operation.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 shows a schematic view of a semiconductor device in accordance with a first preferred embodiment of the present invention; and FIG. 2 shows a schematic view of a semiconductor device in accordance with a second preferred embodiment of the present invention.

DETAILED DESCRIPTION OF THE PREFERRED EMBODIMENT

First, a description is given below of a semiconductor device in accordance with a first preferred embodiment of the present invention with reference to FIG. 1.

FIG. 1 shows a schematic view of a semiconductor device in accordance with a first preferred embodiment of the present invention. The semiconductor device illustrated can be operated in a normal operating mode and a test mode. A circuit arrangement is described below when the semiconductor device is operated in the test mode.

The semiconductor device shown comprises a device for providing test input data or a test data generator 50. The test input data used for the test are provided in the test data generator 50. By way of example, corresponding test data may be generated by an external test unit and be communicated to the semiconductor device. In such a case, the test data generator 50 is essentially designed for receiving and, if necessary, correspondingly processing the test data.

The output of the test data generator 50 is signal-connected to the data input of a first flip-flop FF1. A clock signal DCLK is present at the clock input of the first flip-flop FF1. The DCLK clock signal is used for a read-out of the test input data provided in the test data generator 50, and the data present at the data input of the first flip-flop FF1 being input with the edge of said clock signal.

Furthermore, an output driver 10 for the data signal DQ is signal-connected to the signal output of the first flip-flop FF1. The output driver 10 is signal-connected to a data pad 12. The data pad 12 is signal-connected to a data contact or ball 14, via which the semiconductor device can be connected to an external circuit. Data signals DQ are transmitted via the data contact 14. Furthermore, the data pad 12 is signal-connected to an input driver 16. The input driver 16 is signal-connected to the data input of the second flip-flop FF2.

Furthermore, an input driver 18 for a data clock signal DQS and an output driver 20 for a clock signal are provided. The input driver 18 and the output driver 20 are signal-connected to a data clock pad 22 and the latter is signal-connected to a data clock contact or ball 24. The output of the input driver 18 is signal-connected to the clock input of the second flip-flop FF2. The output of the second flip-flop FF2 is signal-connected in the test mode to a device for generating a data test result or data test result generating device 28, which device will be described later.

Furthermore, a third flip-flop FF3 is provided, at the clock input of which a clock signal SCLK for a data clock signal is provided. The signal output of the third flip-flop FF3 is signal-connected to the input of the output driver 20. Consequently, with each clock of the clock signal SCLK, a clock is output to the data clock pad 22 via the output driver 20.

The semiconductor device has a multiplicity of the configurations described above. However, only one path for data signals DQ and one path for data clock signals DQS are specified here for the sake of simplicity.

The operation of the semiconductor device in the test mode is described below. For this purpose, an external test device firstly transmits a signal to the semiconductor device that the latter is to be operated in the test mode. Furthermore, a test pattern or test data is or are transmitted to the semiconductor device by the external test device and kept ready in the test data generator 50. During test operation, the output drivers 10, 20 and input drivers 16, 18 are switched in such a way that a signal transmission is made possible. In a normal operating mode, by contrast, the output drivers 10, 20 and input drivers 16, 18 are switched in particular in such a way as to enable a signal transmission either via the output drivers 10, 20 or input drivers 16, 18.

In the configuration illustrated in FIG. 1, a so-called "internal loop" arrangement is thus made possible, that is to say an internal loop in which test signals provided by the test data generator 50 are transmitted via the output driver 10, the data pad 12 and the input driver 16 into the semiconductor device again.

The detailed sequence is described below.

The test input data provided by the test data generator 50 are latched in the first flip-flop FF1 with the clock signal DCLK, or accepted with the rising or falling edge of the clock signal DCLK, and transmitted via the output driver 10, the data pad 12 and the input driver 16. The test data thus transmitted are latched in the second flip-flop FF2 with a clock signal which is produced from the output signal of the third flip-flop FF3, which has been generated with the aid of the clock signal SCLK and has been transmitted via the output driver 20, the data clock 22 and the input driver 18. The output signal D_out present at the second flip-flop FF2 is then fed to the data test result generating device 28. The data test result generating device 28 creates a data test result, a data test result being, in particular, a test result which is obtained only using the test output data D_out, that is to say without comparison with the test input data. This has the advantage, in particular, that it is not necessary to keep the test input data D_in ready for a comparison with the test output data D_out with a specific timing.

In the data test result generating device 28, in accordance with a preferred embodiment, a signature is formed from the test output data D_out, which are output in particular at the second flip-flop FF2. The signature is, in particular, an unambiguous function of the test output data D_out and is preferably configured in such a way that the probability of the signature being correct even though the data are incorrect is sufficiently low. The signature may be generated, e.g., with the aid of a multiple input signature register (MISR).

In the embodiment shown, the signature S generated from the test output data D_out is output to an external test device, where it is compared with a desired signature.

As an alternative, it may be provided that the signature generated is compared in the semiconductor device with a desired signature stored therein. If the signature generated is compared in the semiconductor device with the desired signature, a test result signal is preferably output to the external test device, said test result signal specifying whether or not the test requirements were met.

The desired signature may preferably be generated experimentally or by simulation. If the desired signature is generated experimentally, a known semiconductor device which meets the requisite or demanded requirements is used for generating the desired signature (so-called "known good device"). For this purpose, it is possible for example to provide relaxed time conditions or time conditions for which error-free operation can essentially be ensured, in order to enable entirely satisfactory operation of the semiconductor device and thus to obtain an essentially error-free comparison test result.

If the desired signature is to be generated with the aid of a simulation, this may be performed computationally.

The signature may essentially be generated from serial test output data which are output by the second flip-flop FF2. As an alternative, the output of the second flip-flop FF2 may be signal-connected to a serial-to-parallel conversion device (not illustrated) which converts the received serial test output data into at least partially parallel data. The signature can then be generated from the parallel data.

It may furthermore be provided that, instead of calculating a signature, a redundancy is provided in the test input data. This redundant information can then be used for generating a data test result without requiring a signature.

By way of example, in the case of an 8-bit test word, that is to say a test word having a length of 8 bits, the eighth bit may represent the checksum of the other seven bits. Consequently, by checksum formation of the test output data and comparison with the respective eighth bit, it is possible to determine whether or not an error occurred during test operation.

Furthermore, it may be provided that a multiplicity of signature generating devices are provided on or in the semiconductor device. By way of example, the semiconductor device may be designed in such a way that if the test output data are output at different locations of the semiconductor device, the respective locally adjacent test output data are used for calculating a signature.

As an alternative to the methods described above, it is possible to use further suitable signature or redundancy methods.

A second preferred embodiment of the present invention will now be described with reference to FIG. 2. FIG. 2 is a schematic view of a semiconductor device in accordance with a second embodiment.

The embodiment shown in FIG. 2 corresponds to that embodiment shown in FIG. 1 with the difference that here a so-called external loop is formed in the test mode. In this case, a first data contact 30 is connected to a second data contact 32 via an external load resistor $R_L$. The first data contact 30 is signal-connected to a first data pad 34 and the second data contact 32 is signal-connected to a second data pad 36. In a similar manner to this, two data clock contacts 38 and 40 are signal-connected to one another via an external load resistor $R_L$ during the test mode.

In the test mode, a so-called external loop is formed, then, by the output driver 10, which is signal-connected to the first data pad 34, the data pad 34, the first data contact 30, the second data contact 30, the second data pad 36 and the input driver 16 signal-connected to the second data pad 36. In this case, the output drivers 10 and input drivers 16 are each switched in such a way that the output driver 10 associated with a first data contact enables a signal transmission, and the input driver 16 associated with the second data contact 32 in the paired arrangement enables a signal transmission. The respective other output drivers 10 and input drivers 16 are switched in such a way that signal transmission is not made possible. A similar arrangement is produced for the data clock signals DQS. The operation of the semiconductor device in the test mode is the same as that in accordance with the second embodiment and a detailed description thereof is dispensed with.

In a preferred embodiment, the semiconductor device is designed as a semiconductor memory device comprising a memory area having a multiplicity of memory cells arranged in an array. The memory area is used for storing data in the normal operating mode. The memory area is preferably signal-connected via a plurality of connecting lines to a parallel-to-serial conversion device. In the parallel-to-serial conversion device, data read out from the memory area in parallel are converted into serial data.

During test operation, the memory area and the parallel-to-serial conversion device form part of the test data generator 50. In particular, test input data communicated by an external test unit are stored in the memory area. During test operation, the stored data are read out serially IN PARALLEL?? from the memory area, converted into serial test input data by the parallel-to-serial conversion device and fed to the first flip-flop FF1.

The further test procedure is performed as described with reference to FIGS. 1 and 2.

Furthermore, it may be provided that although the semiconductor device is not a semiconductor memory device, it likewise has a memory area at least in the test mode. In this case, the test data can be stored in said memory area.

In FIGS. 1 and 2, provision is made of a so-called "loop back" configuration for testing, in which test signals are passed via output drivers, at least one data pad, and input drivers to the semiconductor memory device and are evaluated in the semiconductor memory device.

By creating a data test result only using the test output data, a test of the interface timing of a semiconductor memory device can be carried out in a simple and advantageous manner. In this case, it is not necessary to keep the test input data or original data ready for a comparison with the test output data.

Furthermore, provision is made of a loop-back method for measuring the interface timing of semiconductor devices with the aid of signatures and/or parity methods.

While the foregoing is directed to embodiments of the present invention, other and further embodiments of the invention may be devised without departing from the basic scope thereof, and the scope thereof is determined by the claims that follow.

What is claimed is:

1. A method for testing a semiconductor device, comprising:
    communicating test input data to the semiconductor device;
    performing a test of the semiconductor device using the test input data to obtain test output data, the test comprising:
        outputting the test input data by an output driver of the semiconductor device; and
        inputting the output test input data into an input driver of the semiconductor device, thereby generating test output data from the output test input data, wherein the output driver is signal-connected to a first data pad, the first data pad is signal-connected to a first external data contact, the first external data contact is signal-connected to a second external data contact, the second external data contact is signal-connected to a second data pad, and the second data pad is signal connected to the input driver, during the test to enable the test input data to be simultaneously output from and input to the semiconductor device; and creating a data test result from the test output data.

2. The method of claim 1, wherein creating the data test result comprises: creating a signature from the test output data; and comparing the created signature with a desired signature.

3. The method of claim 2, wherein the comparison is performed by the semiconductor device.

4. The method of claim 2, wherein the comparison is performed by an external test device.

5. method of claim 1, wherein the test output data and the test input data contain redundant information corresponding to the test input data, and wherein creating the test result comprises:
using the redundant information of the test output data to determine if the test output data was correctly generated from the test input data.

6. The method of claim 5, wherein the redundant information comprises parity bits within the test input data corresponding to a predetermined number of bits of other test input data.

7. A semiconductor device, comprising:
an input driver;
an output driver; and
circuitry configured to:
receive test input data;
perform a test of the semiconductor device using the test input data to obtain test output data, the test comprising:
outputting the test input data from the output driver; and
inputting the output test input data into the input driver, thereby generating test output data from the test input data, wherein the output driver is signal-connected to a first data pad, and the first data pad is signal-connected to a first external data contact, and the first external data contact is signal-connected to a second external data contact, and the second external data contact is signal-connected to a second data pad, and the second data pad is signal connected to the input driver, during the test to enable the test input data to be simultaneously output from and input to the semiconductor device; and
create a data test result from the test output data.

8. The semiconductor device of claim 7, wherein the circuitry further comprises a multiple input source register configured to generate a signature from the test output data, and wherein the circuitry is further configured to compare the generated signature with a desired signature.

9. semiconductor device of claim 7, further comprising
a clock output pad;
a clock input pad;
a flip-flop connected to the input driver and controlled by clock input pad; and
an external connection between the clock output pad and the clock input pad, wherein a signal output by the clock output pad inputs data from the input driver into the flip-flop.

10. A semiconductor device, comprising:
means for inputting;
means for outputting;
means for connecting; and
means for controlling configured to:
receive test input data;
perform a test using the test input data to generate test output data, the test comprising:
outputting the test input data from the means for outputting; and
inputting the output test input data into the means for inputting, thereby generating test output data from the output test input data, wherein the means for inputting and the means for outputting are connected during the test to enable the test input data to be simultaneously output from and input to the semiconductor device, and
the means for connecting the means for inputting and the means for outputting is external to the semiconductor device; and
create a data test result from the test output data.

11. The semiconductor device of claim 10, wherein the means for controlling further comprises a means for signature generating configured to generate a signature from the test output data, and wherein the means for controlling is further configured to compare the generated signature with a desired signature.

12. The semiconductor device of claim 10, further comprising:
means for contacting, wherein the means for inputting and the means for outputting are connected to the means for contacting, and wherein the connection between is internal to the semiconductor device.

13. The semiconductor device of claim 12, further comprising:
means for outputting a first clock signal;
means for inputting a second clock signal;
means for latching connected to means for inputting; and
means for connecting to a third clock signal, wherein the means for outputting the first clock signal and the means for inputting the second clock signal are connected to the means for connecting to the third clock signal, wherein the means for outputting the first clock signal is connected to the means for inputting the second clock signal, and wherein the means for inputting the second clock signal is used to input data from the means for inputting into the means for latching.

14. A method for performing a test of a memory device, the method comprising:
reading test input data into a memory array of the memory device from an external testing device;
outputting the test input data in the memory array from an output driver of the memory device;
inputting the test input data output by the output driver into an input driver of the memory device, thereby generating test output data, wherein the output driver is signal-connected to a first data pad, the first data pad is signal-connected to a first external data contact, the first external data contact is signal-connected to a second external data contact, the second external data contact is signal-connected to a second data pad, and the second data pad is signal connected to the input driver; and
determining if the test was successful by determining if the output test input data was correctly input into the input driver.

15. The method of claim 14, wherein the test output data is stored in the memory array.

16. The method of claim 14, wherein the test input data is received in parallel from the external testing device; output from the memory array in parallel, and converted into serial data before outputting the test input data from the output driver.

17. The method of claim 16, wherein the serial data are input by the input driver, thereby generating serial test output data, and wherein the serial test output data are converted to parallel data.

18. The method of claim 14, wherein an order of outputting the test input data from the memory array is altered during a plurality of tests to generate a different test pattern for each of the plurality of tests.

19. A memory device comprising:
a device for providing test input data;
an output driver;
an input driver;
a first data pad;
a second data pad;
test circuitry configured to:
connect the output driver to the first data pad; and
connect the input driver to the second data pad, wherein the first data pad is signal-connected to a first external data contact, the first external data contact is signal-connected to a second external data contact, and the second external data contact is signal-connected to a second data pad, and wherein the test input data are simultaneously output from the output driver and input to the input driver to obtain test output data; and
a data test result generating device configured to create a data test result from the test output data.

20. The memory device of claim 19, wherein the data test result generating device comprises a signature device configured to generate a signature from the test output data.

21. The memory device of claim 20, further comprising a signature comparison device for comparing the created signature with a desired signature.

22. The memory device of claim 21, further comprising a signature register for creating the signature.

23. The memory device of claim 19, wherein the test input data comprises first redundant information and wherein the memory device further comprises a device for generating the data test result using redundant information of the test output data corresponding to the first redundant information.

24. The memory device of claim 19, wherein an external test unit places the memory device into the test mode for a test operation.

* * * * *